(12) United States Patent
Olivadese

(10) Patent No.: US 10,716,202 B2
(45) Date of Patent: *Jul. 14, 2020

(54) CROSSTALK MITIGATION FOR PCB TO DIE TRANSITION IN SUPERCONDUCTING DEVICES

(71) Applicant: International Business Machines Corporation, Armonk, NY (US)

(72) Inventor: Salvatore Bernardo Olivadese, Stamford, CA (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/513,957

(22) Filed: Jul. 17, 2019

(65) Prior Publication Data
US 2019/0350074 A1 Nov. 14, 2019

Related U.S. Application Data

(63) Continuation of application No. 15/974,302, filed on May 8, 2018, now Pat. No. 10,390,423.

(51) Int. Cl.
*H01L 23/552* (2006.01)
*H01L 23/66* (2006.01)
(Continued)

(52) U.S. Cl.
CPC .......... *H05K 1/0216* (2013.01); *G06N 10/00* (2019.01); *H01L 23/552* (2013.01); *H01L 23/66* (2013.01); *H01L 24/48* (2013.01); *H01L 27/18* (2013.01); *H04B 3/32* (2013.01); *H05K 9/0077* (2013.01); *H01L 2223/6611* (2013.01);
(Continued)

(58) Field of Classification Search
CPC .......... H01L 23/552; H01L 2223/6611; H05K 9/0077
See application file for complete search history.

(56) References Cited

U.S. PATENT DOCUMENTS 5,453,691 A 9/1995 David et al.
5,459,284 A 10/1995 Bockelman et al.
(Continued)

FOREIGN PATENT DOCUMENTS

EP 3 002 787 A1 4/2016
WO 2017/099759 A1 6/2017

OTHER PUBLICATIONS

Ex Parte Quayle Action received for U.S. Appl. No. 15/974,302 dated Jan. 28, 2019, 14 pages.
(Continued)

*Primary Examiner* — Hung V Ngo
(74) *Attorney, Agent, or Firm* — Amin, Turocy & Watson, LLP

(57) ABSTRACT

The subject disclosure relates generally to a method of implementing magnetic shielding walls with specific respective dimensions to reduce crosstalk between transmission lines in wire-bonds for supercomputing chipsets. In one embodiment, the device comprises: a chip-set comprised of superconducting materials; at least one superconducting data line attached to chip-set dies by a set of wire bonds; and magnetic shielding walls that respectively isolate the set of wire bonds.

20 Claims, 7 Drawing Sheets

(51) Int. Cl.
  *H01L 23/00* (2006.01)
  *H05K 9/00* (2006.01)
  *H05K 1/02* (2006.01)
  *H04B 3/32* (2006.01)
  *G06N 10/00* (2019.01)
  *H01L 27/18* (2006.01)

(52) U.S. Cl.
  CPC ............ *H01L 2224/45124* (2013.01); *H01L 2224/45139* (2013.01); *H01L 2224/45144* (2013.01); *H01L 2224/45147* (2013.01); *H01L 2224/4809* (2013.01)

(56) References Cited

U.S. PATENT DOCUMENTS

| | | | |
|---|---|---|---|
| 5,471,010 | A | 11/1995 | Bockelman et al. |
| 5,639,989 | A | 6/1997 | Higgins, III |
| 6,765,301 | B2 * | 7/2004 | Wu ............... H01L 23/49838 257/690 |
| 7,667,321 | B2 | 2/2010 | Rebelo et al. |
| 7,863,716 | B2 | 1/2011 | Ali et al. |
| 7,990,662 | B2 | 8/2011 | Berkley et al. |
| 8,115,509 | B2 | 2/2012 | Takada |
| 8,558,398 | B1 | 10/2013 | Seetharam |
| 8,664,774 | B1 | 3/2014 | Mosinskis |
| 9,214,431 | B1 | 12/2015 | Terrovitis |
| 9,465,401 | B2 | 10/2016 | Uchaykin |
| 2002/0012234 | A1 | 1/2002 | Harada et al. |
| 2002/0118528 | A1 | 8/2002 | Su et al. |
| 2006/0043587 | A1 | 3/2006 | Lim et al. |
| 2006/0065983 | A1 | 3/2006 | Chia et al. |
| 2007/0115359 | A1 | 5/2007 | Tey et al. |
| 2008/0099905 | A1 | 5/2008 | Ali et al. |
| 2010/0319981 | A1 | 12/2010 | Kapusta et al. |
| 2013/0043961 | A1 | 2/2013 | Gebauer et al. |
| 2013/0134579 | A1 | 5/2013 | Howard et al. |
| 2015/0002229 | A1 | 1/2015 | Kuo et al. |
| 2017/0071082 | A1 | 3/2017 | Sadleir |
| 2017/0178018 | A1 | 6/2017 | Tcaciuc et al. |
| 2017/0373658 | A1 | 12/2017 | Thom et al. |

OTHER PUBLICATIONS

Mariantoni et al., "Photon shell game in three-resonator circuit quantum electrodynamics", Nature Physics, vol. 7, Apr. 2011, pp. 287-293.

Chandrasekhar et al., "Characterisation, Modelling and Design of Bond-Wire Interconnects for Chip-Package Co-Design", 33rd European Microwave Conference, 2003, pp. 301-306.

Hamilton, W.O., "Superconducting shielding", Revue de Physique Appliquee, vol. 5, No. 1, 1970, 9 pages.

International Search Report and Written Opinion received for PCT Application Serial No. PCT/EP2019/060479 dated Aug. 5, 2019, 14 pages.

List of IBM Patents or Applications Treated as Related.

\* cited by examiner

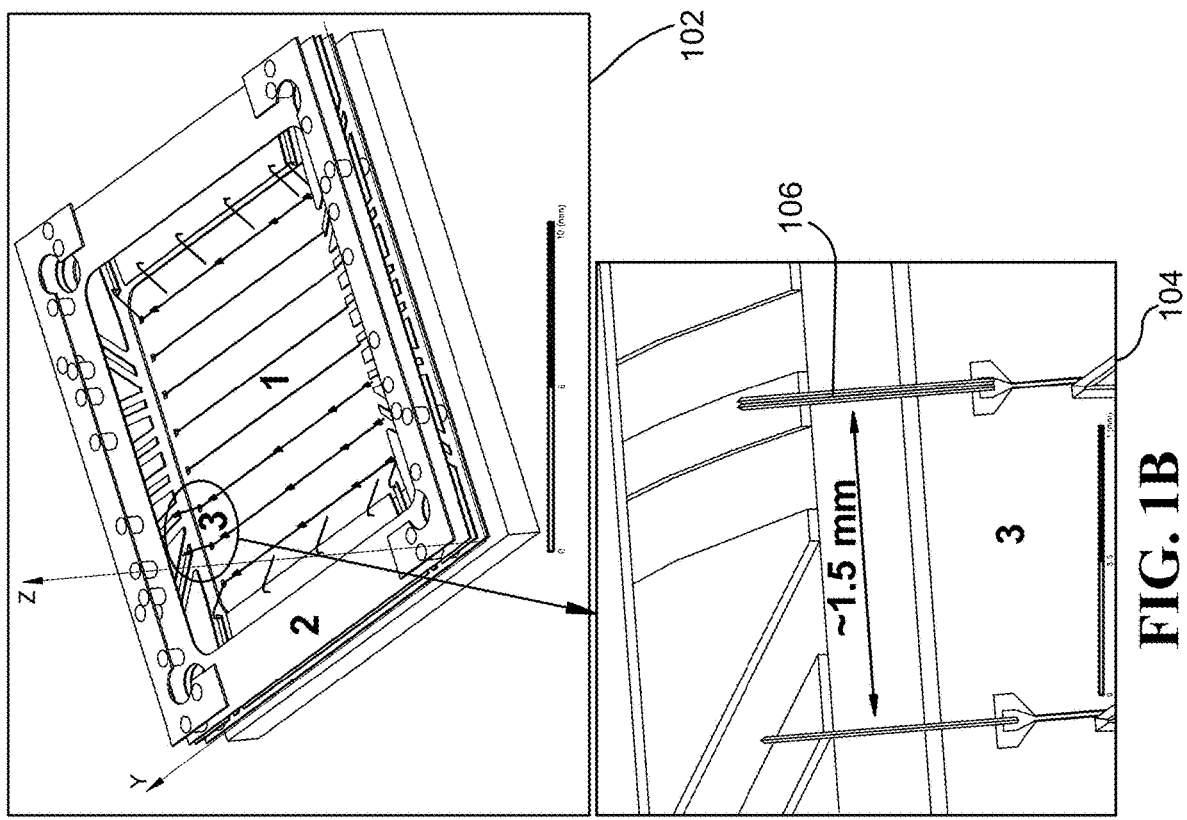

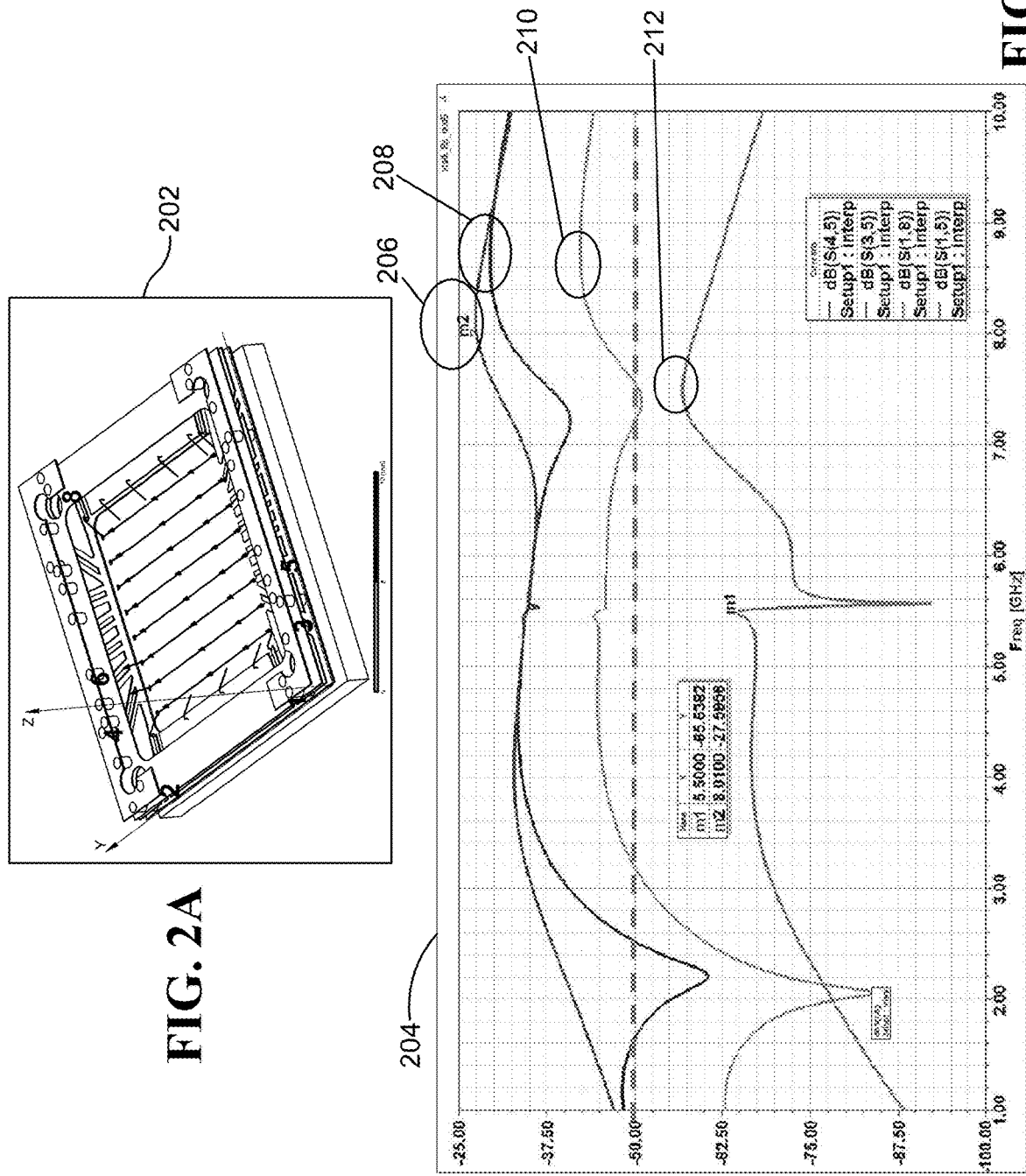

CROSSTALK MITIGATION FOR PCB TO DIE TRANSITION IN SUPERCONDUCTING DEVICES

TECHNICAL FIELD

The subject disclosure relates generally to a method of implementing magnetic shielding walls with specific respective dimensions to reduce crosstalk between transmission lines in wire-bonds for supercomputing chipsets.

SUMMARY

The following presents a summary to provide a basic understanding of one or more embodiments of the invention. This summary is not intended to identify key or critical elements, delineate scope of the particular embodiments or scope of the claims. Its sole purpose is to present concepts in a simplified form as a prelude to the more detailed description that is presented later. In one or more embodiments described herein, systems, computer-implemented methods, apparatus and/or computer program products that facilitate the production of a final product in a context are described.

Crosstalk in electronics can be defined as when a signal transmitted on one circuit or channel of a transmission line (or system) creates an unintended material impact in another circuit or channel. This event typically is caused by electric or magnetic fields of one telecommunication signal affecting a signal in an adjacent circuit. For supercomputing devices (e.g., where crosstalk tolerance is highly sensitive), impact of crosstalk can significantly increase risk of corrupted signals and can lead to unpredictable or faulty circuit behavior.

When utilizing supercomputing technology devices, several specific sections of potential crosstalk impact can be observed, the PCB (printed circuit board) section, the chip transmission line section on a die, or wire-bonds that connect the PCB to the quantum chip die transmission lines. The wire-bonds are typically very close in physical proximity to adjacent wire bonds and therefore can increase distortion of each wire bond signal due to electromagnetic interference and or voltage leakage.

This innovation develops a novel solution to mitigate crosstalk between a subset of wire bonds (e.g., the transition wires between the PCB and the chip-die) on a supercomputing device by inserting magnetic shielding walls between wire-bonds to mitigate crosstalk to below a satisfactory threshold (e.g., below −50 dB) for crosstalk on supercomputing devices. The walls should decouple respective signals to such acceptable pre-defined level.

Wire-bonds usually consist of one of the following materials: Aluminum, Copper, Silver or Gold and diameters generally start at 15 µm and can be up to several hundred micrometers for high-powered applications. The innovation employs magnetic shielding walls between adjacent high-risk target wire bonds. The walls can utilize any suitable material (e.g., non-supercomputing material or a type-1 superconducting metal) and so as to mitigate crosstalk between specific wire-bonds below an acceptable threshold (e.g., below −50 dB)

According to an embodiment, a device, comprises a chip-set comprised of superconducting materials; where at least one superconducting transmission line is attached to chip-set dies by a set of wire bonds; and magnetic shielding walls that respectively isolate respective wire bonds and reduce the crosstalk dB level below −50 dB.

DESCRIPTION OF THE DRAWINGS

FIGS. 1A-B illustrate superconducting transmission lines on a Silicon substrate in accordance with an implementation.

FIG. 1C depicts a quantum device, e.g., superconducting transmission lines connected to qubits in accordance with an implementation.

FIG. 2A depicts the quantum chip shown in FIG. 1A with addition of testing location ports in accordance with an implementation.

FIG. 2B illustrates crosstalk levels on a scattering parameters graph in units of dB between transmission lines on the quantum chip represented in FIG. 2A in accordance with an implementation.

DETAILED DESCRIPTION

Figure 3A:
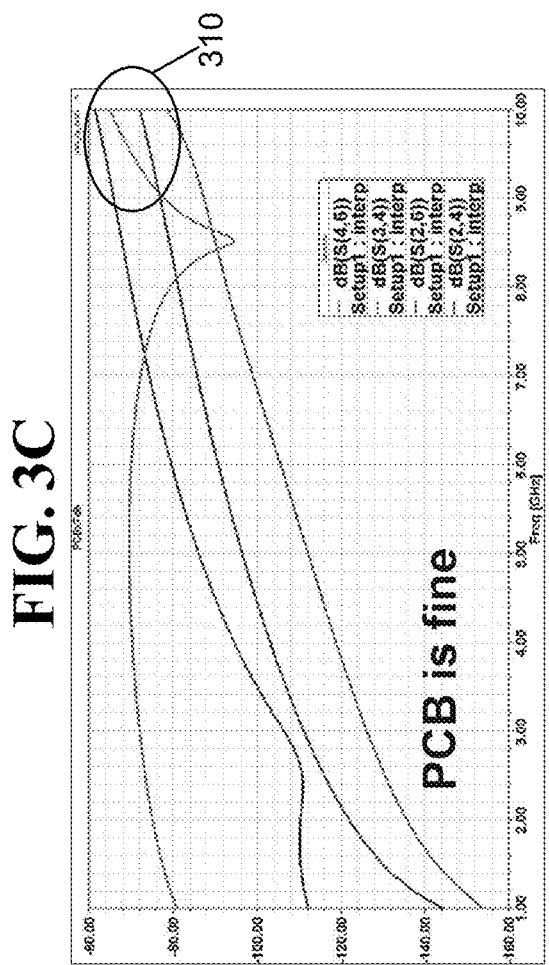
FIG. 3A-D illustrates crosstalk levels on a scattering parameters graph in units of dB for transmission lines on a PCB and Die in accordance with an implementation.

The following detailed description is merely illustrative and is not intended to limit embodiments and/or application or uses of embodiments. Furthermore, there is no intention to be bound by any expressed or implied information presented in the preceding Summary section, or in the Detailed Description section. One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident; however, in various cases, that the one or more embodiments can be practiced without these specific details.

Superconductors are materials that exhibit certain properties when cooled down to a certain temperature. When such materials reach a specific temperature, they become near ideal conductors with a resistance of about zero. Accordingly, current in a superconductor can flow without much if any loss.

Superconductors are highly sensitive to noise and possible corruption of transmission signals critical to perform an application as compared to non-superconductors. For this innovation, intrusion of a potential destructive form of interference is disclosed within a circuit that can impact superconductor data integrity and compromise its functionality along with the innovation's solution to mitigate such negative impact.

An issue this innovation addresses is reducing negative impact of "crosstalk" in a superconductor device with single ended lines (as opposed to differential lines).

Superconducting qubits operate within a small bandwidth (e.g., 100 MHz) near 5 GHz range, and additional components for control of the qubits operate between about 6 GHz to 10 GHz. Simulations discussed in the upcoming drawings plot crosstalk results within 1-10 GHz (as shown in FIG. 2B, 3C, 3D, 5B). Crosstalk has become a critical destructive source to performance degradation and signal integrity problems in design of high-speed printed circuit boards and worsens with higher frequencies. Since transmission lines typically need to be close in proximity due to high density of interconnections within a superconducting device, risk of corrupting one signal from an adjacent line becomes highly probable. Common symptoms of crosstalk are re-transmissions, which will can cause significant random slowdowns leading to unpredictable results and potential failure of a circuit.

There have been many options undertaken to mitigate crosstalk over the years. Concepts have been applied such as proposed various signal routing topologies to reduce crosstalk between adjacent lines, however, this increases footprint required on a printed circuit board. Other attempts such as driver sizing, wire spacing, defined wirebond arrangements, optical specific technology, along with simultaneously buffering and routing have been developed to reduce crosstalk noise. However, these existing solutions do not achieve a cross-talk reduction near −50 dB because for classical applications in the semiconductor industry, −30 dB is considered sufficient for a quality signal. Some of these potential solutions can be implemented after circuit design, however an objective is to design into a circuit mitigating features prior to fabrication.

The subject innovation can mitigate or reduce crosstalk to below −50 dB on a superconductor device using single ended lines. As noted, in classical applications, −30 dB isolation is often sufficient but quantum devices require greater isolation due to heightened sensitivity and greater tolerance requirements.

Diagrams in the following section will depict actual testing results to reflect reduction in crosstalk after implementation of magnetic shielding walls. The testing will follow a clear step by step process: Check for Crosstalk between specific transmission line end points (or ports) on the circuit. If Crosstalk is measured above a limit of −50 dB, the destructive noise can originate in specific areas. These areas are: between transmission lines on a die (referred to as traces), between lines on a PCB itself, or between wire-bond transmission lines that connect trace lines to PCB lines (referred to as PCB to Die transition). Testing data will indicate that overall Crosstalk was observed, and simulations indicated that the crosstalk was not driven by noise at the trace level or the PCB transmission line level. Therefore, crosstalk was significant at a wirebond level and this is an area that the innovation will target. The data shows that crosstalk observed (e.g., from same initial comparison data points to same data points post-wall insertion) was reduced by constructing and installing magnetic shielding walls.

FIG. 1A illustrates a schematic of a chip (102) and basic transmission lines within each defined area. Transmission lines on the Die are defined as "1" on chip 102. The transmission lines on the PCB are referred to as "2" and wire-bonds connecting the PCB and the die transmission lines are noted as "3". At FIG. 1B, 104 displays a magnified scope of wire-bonds 106 and for a chip, with a distance of approximately 1.5 mm between them. The wire-bonds 106 are a transition connection wires between the die lines and the PCB lines. FIG. 1C depicts an actual physical quantum chip circuit 108 that shows the transmission lines on the die, notes as [1] on the chip at FIG. 1A.

FIGS. 2A and 2B illustrate initial data from testing for crosstalk between certain points or ports 1-8 (FIG. 2A). A chip 202 to be tested is depicted, and at FIG. 2A various levels of crosstalk interference are displayed on chart 204. There are specific simulations taken between four different lines (ports). Line 206 illustrates crosstalk levels between lines (or ports) 4 and 5 (FIG. 2A). Line 208 illustrates crosstalk levels between lines (or ports) 3 and 5 (FIG. 2A). Line 210 depicts crosstalk levels between lines (or ports) 1 and 5 (FIG. 2A). Line 212 illustrates crosstalk levels between lines (or ports) 1 and 8 (FIG. 2A).

The results from this test indicate the following: crosstalk between lines 4 and 5 at a maximum of −27 dB at about 8 GHz. The section pointed out by 206 focuses on such specific data point. Crosstalk between lines 3 and 5 are at a maximum of −30 dB at about 8.5 GHz. The section pointed out by 208 focuses on that specific data point. Crosstalk between lines 1 and 5 are at a maximum of −45 dB at about 8.5 GHz. The section pointed out by 210 focuses on that specific data point. All three of these levels are above the −50 dB deemed as acceptable crosstalk between lines for a device. A last simulation 212, is below −50 dB for an entire frequency spectrum on the scattering parameters graph and therefore at an acceptable level. This is likely due to largest physical distance between these two lines compared to others.

Figure 3B:
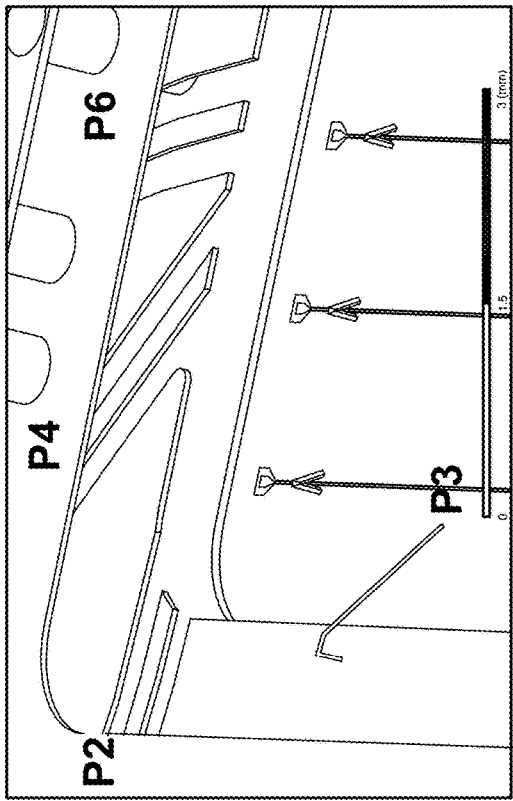
Figure 3C:
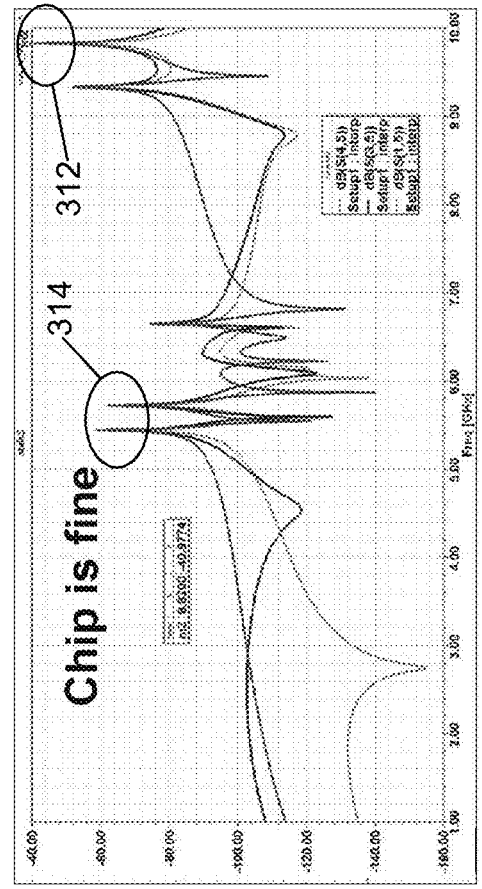
Figure 3D:
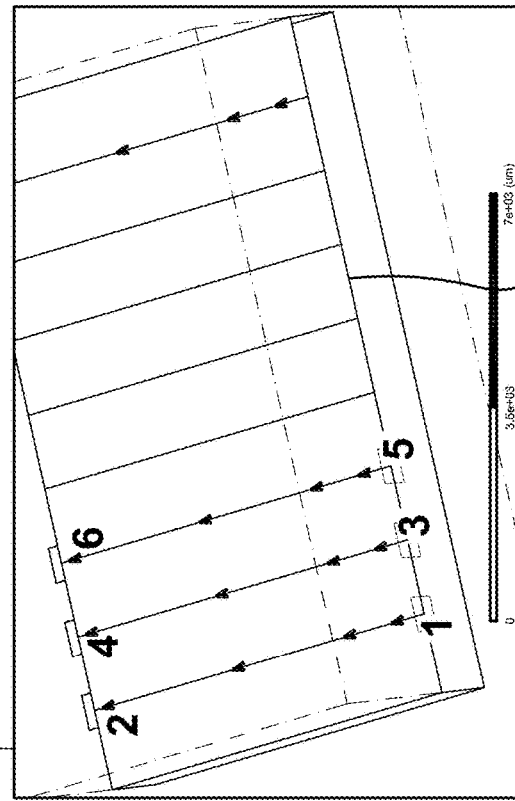

FIGS. 3A-3D displays crosstalk data taken between transmission lines within certain geographical areas and displayed on a scattering parameters graph. At FIG. 3A, physical locations of four (P2, P3, P4, and P6) transmission lines located on a PCB. FIG. 3B depicts six parallel transmission line ports (numbers 1-6) on a Die 308. The numbers 1-6 in FIG. 3B are the input and output ports associated to the three adjacent lines. FIG. 3C illustrates results from testing crosstalk levels between lines on a PCB which shows all crosstalk dB levels are below −50 dB and approach −60 dB near the 10 GHz frequency level (310). FIG. 3D depicts results from testing crosstalk levels between lines on the Die 308, which shows all crosstalk levels are below the −50 dB minimum requirement, as a peak for middle of the range frequencies (5-7 GHz) is about −60 dB (314) and closer to −50 dB at the extreme range of 10 GHz (312). The conclusion from this testing indicates that crosstalk within this device is not occurring at the PCB or die transmission level, but at a wire-bond level.

Figure 4:
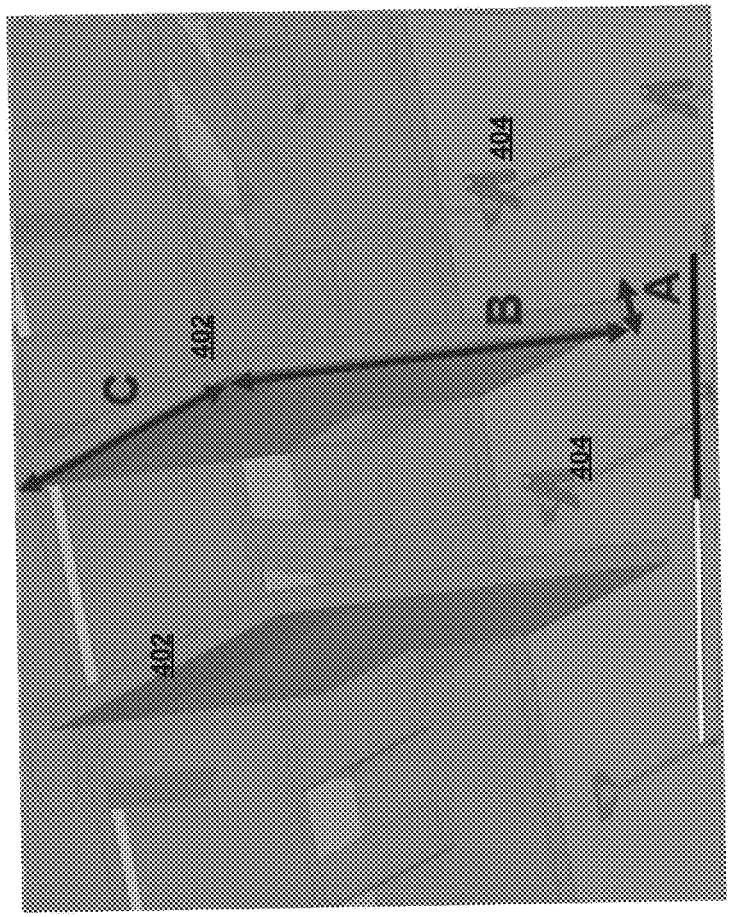
FIG. 4 illustrates dimensions and layout of the magnetic shielding walls between wire bonds in accordance with an implementation.

FIG. 4 illustrates an aspect of the subject innovation where magnetic shielding walls 402 with dimensions (A (width), B (height) and C (length)) as shown isolating wire-bonds 404. For this innovation, thickness of the walls 402 (A) using non-supercomputing material such as copper, should be greater than skin depth. If the wall 402 is made from type-1 superconductor material (e.g., aluminum), the thickness is limited by London penetration (London penetration depth defines thickness in which supercurrents flow to counteract external magnetic field). In at least one non-limiting embodiment, length of the wall 402 (C) should be at least 5× of the wire-bond 404 extension, and height of the wall 402 (B) should be at least 2× that of wire-bond height. These walls 402 can be constructed as part of fabrication of a circuit or soldered in after. It is appreciated that dimension ratios can be varied in embodiments as a function of various parameters and conditions.

Figure 5A:
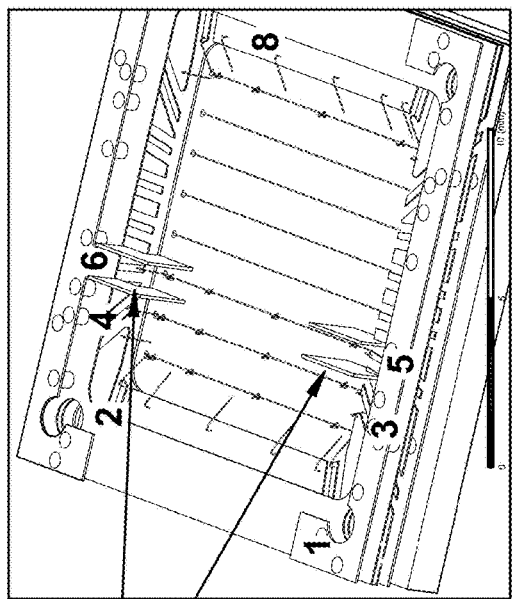
FIG. 5A illustrates magnetic walls in place between specific transmission locations in accordance with an implementation.
Figure 5B:
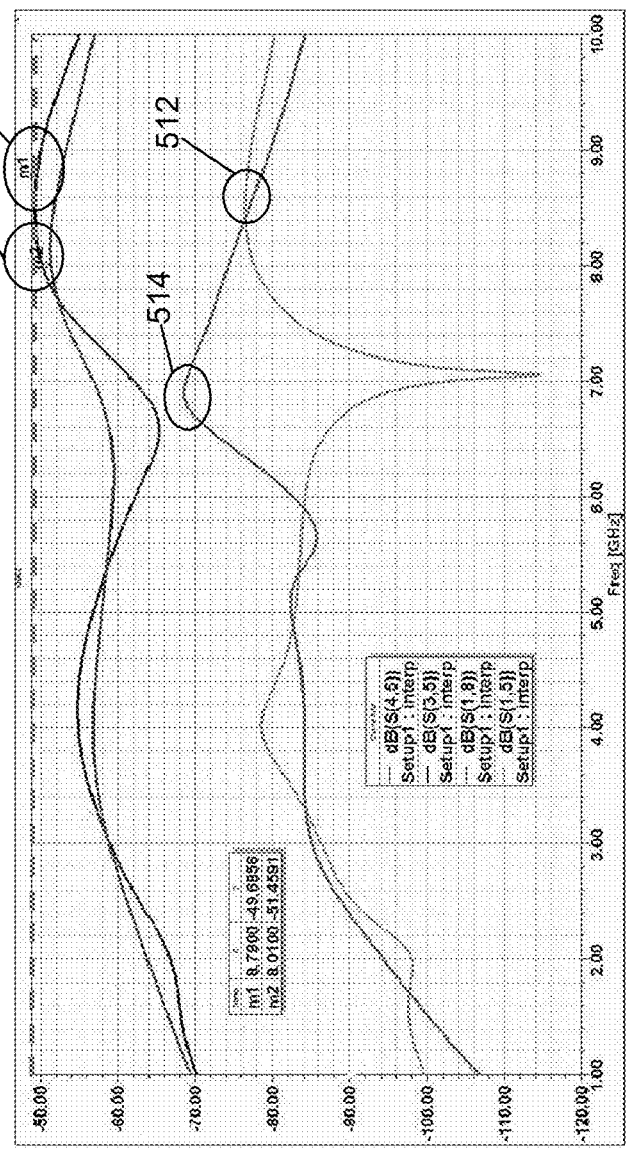
FIG. 5B illustrates crosstalk level on a scattering parameters graph in units of dB between transmission lines after inserting magnetic walls in accordance with an implementation.

FIGS. 5A and 5B illustrate crosstalk data from same location ports tested in connection with FIG. 2—now with crosstalk dB levels after utilizing magnetic shielding walls 502 that have been constructed or inserted. FIG. 5A depicts a chip-set (like 202 of FIG. 2) but with added magnetic shielding walls 502. The numbers in FIG. 5A specify input and output ports for each line. For each line there are two ports. The lines with ports 6-5 is shielded from the line with ports 3-4 by the magnetic walls. The ports numbers are employed for the scattering parameters in FIG. 5B and similar plots. In the plot legend one can see S(4,5), which is the scattering parameter associated to ports 4 and 5, e.g., flow of power between ports 4 and 5. FIG. 5B illustrates a crosstalk data chart that reflects crosstalk dB levels after the same test as performed in connection with FIG. 2. Line 508 is a data line illustrating crosstalk level between ports 4 and 5. From the crosstalk dB test prior to insertion of walls 402, the crosstalk dB level was −27 dB (FIG. 2), and now the comparison post wall insertion, the new crosstalk dB level between the same points is −51 dB. In another comparison, line 510 which illustrates cross-talk level from 3 and 5, was −30 dB previously without the walls 402, and now it is −50 dB after deployment of the magnetic shielding walls. Line 512 shows a new dB level for 1 and 5 ports has dropped from −45 dB to −75 dB. Finally, line 514 depicts the crosstalk level from ports 1 and 8, it has dropped from −60 dB to −70 dB. The results from these crosstalk tests show that after employment of the magnetic shielding walls, there was clear measurable drop in crosstalk levels at all comparison points.

Figure 6A:
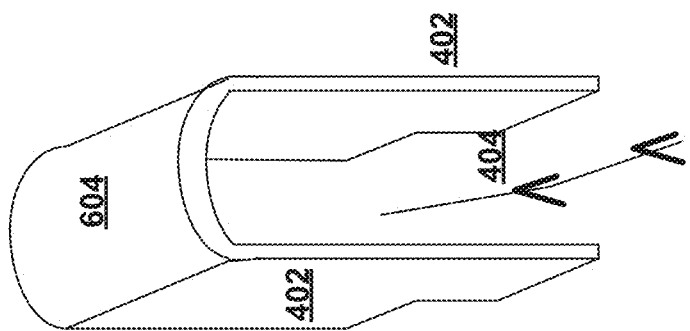
FIGS. 6A and 6B illustrate various non-limiting embodiments of magnetic shielding structures.
Figure 6B:
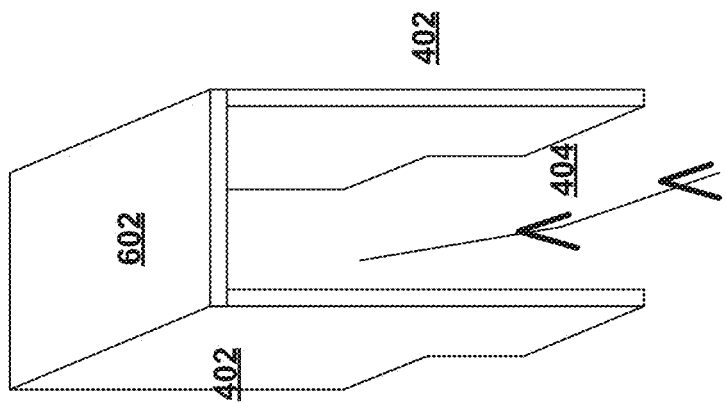

FIGS. 6A and 6B illustrate alternative embodiments where the magnetic shield walls 502 can include roof or enclosing portions 602, 604. The roof portions can be flat, curved, solid or not solid as desired to facilitate mitigation of cross-talk across respective wire-bonds. It is to be appreciated that any suitable magnetic shielding material and wall thickness, height and depth can be utilized in connection with mitigating cross-talk levels to below −50 dB in accordance with desired ranges for super-conducting quantum circuit applications.

Figure 7:
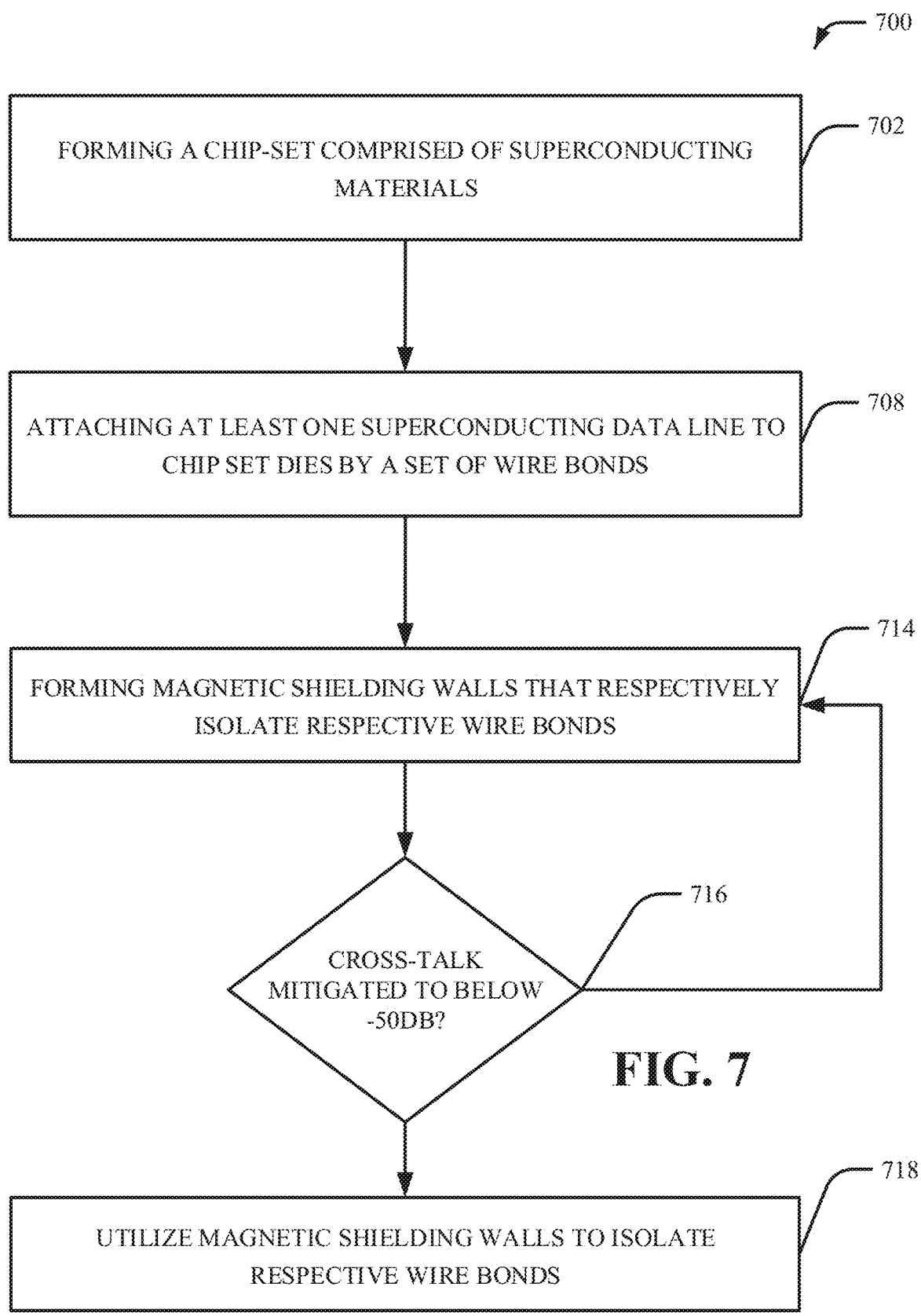
FIG. 7 illustrates a methodology in accordance with an embodiment.

FIG. 7 illustrates a flow chart disclosing a methodology of selecting and utilizing magnetic shielding walls 402 (FIGS. 4 and 5A) to isolate wire-bonds 404 (FIGS. 4 and 5A) of a chip-set (e.g., quantum computing chip-set) and mitigate cross-talk across respective wire-bonds. Act 702 involves forming a chip-set comprised of super-conducting materials. Act 708 reflects attaching at least one superconducting data-line to chip-set dies by a set of wire-bonds 404. At act 714, magnetic shielding walls are formed that respectively isolate respective wire-bonds 404. At 716, testing is performed to determine if cross-talk across respective isolated wire-bonds is below −50 dB. If NO, act 714 is repeated to form a suitable set of magnetic shielding walls (e.g., thickness, height, length or materials can be revised). If YES at 716, at act 718 the magnetic shielding walls 402 are utilized to isolate the respective wire-bonds so as to mitigate crosstalk to below −50 dB or any suitable threshold (e.g., for a given quantum computing application).

As used in this application, the terms "component," "system," "platform," "interface," and the like, can refer to and/or can include a computer-related entity or an entity related to an operational machine with one or more specific functionalities. The entities disclosed herein can be either hardware, a combination of hardware and software, software, or software in execution. For example, a component can be, but is not limited to being, a process running on a processor, a processor, an object, an executable, a thread of execution, a program, and/or a computer. By way of illustration, both an application running on a server and the server can be a component. One or more components can reside within a process and/or thread of execution and a component can be localized on one computer and/or distributed between two or more computers. In another example, respective components can execute from various computer readable media having various data structures stored thereon. The components can communicate via local and/or remote processes such as in accordance with a signal having one or more data packets (e.g., data from one component interacting with another component in a local system, distributed system, and/or across a network such as the Internet with other systems via the signal). As another example, a component can be an apparatus with specific functionality provided by mechanical parts operated by electric or electronic circuitry, which is operated by a software or firmware application executed by a processor. In such a case, the processor can be internal or external to the apparatus and can execute at least a part of the software or firmware application. As yet another example, a component can be an apparatus that provides specific functionality through electronic components without mechanical parts, wherein the electronic components can include a processor or other means to execute software or firmware that confers at least in part the functionality of the electronic components. In an aspect, a component can emulate an electronic component via a virtual machine, e.g., within a server computing system.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What has been described above include mere examples of systems, computer program products, and computer-implemented methods. It is, of course, not possible to describe every conceivable combination of components, products and/or computer-implemented methods for purposes of describing this disclosure, but one of ordinary skill in the art can recognize that many further combinations and permutations of this disclosure are possible. Furthermore, to the extent that the terms "includes," "has," "possesses," and the like are used in the detailed description, claims, appendices and drawings such terms are intended to be inclusive in a manner similar to the term "comprising" as "comprising" is interpreted when employed as a transitional word in a claim. The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
a set of wire bonds that attach at least one superconducting data line to chip-set dies; and
magnetic shielding walls that respectively isolate the set of wire bonds.

2. The device of claim 1, wherein at least one of the magnetic shielding walls has a first height that is about greater than or equal to two times a second height of at least one wire bond extension.

3. The device of claim 1, wherein at least one of the magnetic shielding walls has a first length that is about greater than or equal to five times a second height of at least one wire bond extension.

4. The device of claim 1, wherein at least one of the magnetic shielding walls has a thickness that is about greater than or equal to skin depth.

5. The device of claim 1, wherein a set of magnetic shielding walls shields the at least one superconducting data lines from cross talk.

6. The device of claim 5, wherein two pairs of magnetic shielding walls respectively shield each end of the at least one superconducting data line.

7. The device of claim 1, wherein the at least one superconducting data line comprises a type I superconducting material, and a set of the shielding walls have thicknesses that are a function of London penetration.

8. The device of claim 1, wherein at least one of the magnetic shielding walls is soldered at a transition of the quantum chip-set.

9. The device of claim 1, wherein the magnetic shielding walls attenuate crosstalk to lower than −50 dB.

10. The device of claim 1, wherein the magnetic shielding walls attenuate crosstalk to lower than −60 dB.

11. The device of claim 1, wherein the magnetic shielding walls attenuate crosstalk to lower than −70 dB.

12. The device of claim 1, wherein the device is a quantum computing device.

13. A method to fabricate a quantum computing device, the method comprising:
attaching at least one superconducting data line to chip set dies by a set of wire bonds; and
forming magnetic shielding walls that respectively isolate respective wire bonds.

14. The method of claim 13, further comprising forming at least one of the shielding walls to have a first height that is about greater than or equal to two times a second height of at least one wire bond extension.

15. The method of claim 13, further comprising forming at least one of the shielding walls has a length that is about greater than or equal to five times a height of at least one wire bond extension.

16. The method of claim 13, further comprising:
forming a set of magnetic shielding walls to shield the at least one superconducting data lines from cross talk.

17. The method of claim 13, further comprising forming the magnetic shield walls to attenuate crosstalk across superconducting data lines to lower than −50 dB.

18. A device, comprising:
at least one superconducting data line attached to chip set dies by a set of wire bonds; and
magnetic shielding walls that respectively isolate respective wire bonds,
wherein at least one of the shielding walls has a first height that is about greater than or equal to two times a second height of at least one wire bond extension, and
wherein two pairs of magnetic shielding walls respectively shield each end of the at least one superconducting data line.

19. The device of claim 18, wherein the magnetic shielding walls attenuate crosstalk to lower than −50 dB.

20. The device of claim 18, wherein the magnetic shielding walls attenuate crosstalk to lower than −60 dB.

* * * * *